(12) United States Patent
Schwandner et al.

(10) Patent No.: US 8,338,302 B2
(45) Date of Patent: Dec. 25, 2012

(54) METHOD FOR POLISHING A SEMICONDUCTOR WAFER WITH A STRAINED-RELAXED $SI_{1-x}GE_x$ LAYER

(75) Inventors: Juergen Schwandner, Garching (DE); Roland Koppert, Triftern (DE)

(73) Assignee: Siltronic AG, Munich (DE)

( * ) Notice: Subject to any disclaimer, the term of this patent is extended or adjusted under 35 U.S.C. 154(b) by 392 days.

(21) Appl. No.: 12/610,399

(22) Filed: Nov. 2, 2009

(65) Prior Publication Data

US 2010/0130012 A1    May 27, 2010

(30) Foreign Application Priority Data

Nov. 26, 2008   (DE) .................. 10 2008 059 044

(51) Int. Cl.
*H01L 21/302* (2006.01)
(52) U.S. Cl. .......... 438/693; 438/691; 438/692; 216/89
(58) Field of Classification Search .................. 438/690, 438/691, 692, 693, 697, 753; 216/88, 89, 216/90; 451/285, 287
See application file for complete search history.

(56) References Cited

U.S. PATENT DOCUMENTS

| | | | |
|---|---|---|---|
| 5,400,548 A | | 3/1995 | Huber et al. |
| 5,958,794 A | | 9/1999 | Bruxvoort et al. |
| 6,443,807 B1 | | 9/2002 | Sakai et al. |
| 6,475,072 B1 | | 11/2002 | Canaperi et al. |
| 6,524,935 B1 | * | 2/2003 | Canaperi et al. ............. 438/478 |
| 6,534,378 B1 | * | 3/2003 | Ramkumar et al. ........... 438/401 |
| 6,927,147 B2 | * | 8/2005 | Fitzgerald et al. ........... 438/458 |
| 7,195,544 B2 | * | 3/2007 | Prasad ............................ 451/41 |
| 7,201,634 B1 | * | 4/2007 | Naujok et al. ..................... 451/7 |
| 7,718,534 B2 | * | 5/2010 | Martinez et al. .............. 438/692 |
| 2002/0142705 A1 | * | 10/2002 | Sugiura ........................ 451/41 |
| 2003/0082998 A1 | | 5/2003 | Carter et al. |
| 2003/0089045 A1 | * | 5/2003 | Nakayama et al. ............ 51/308 |
| 2004/0166779 A1 | * | 8/2004 | Balijepalli et al. ............. 451/41 |
| 2004/0259483 A1 | | 12/2004 | Newell |
| 2005/0204639 A1 | | 9/2005 | Ishihara |
| 2005/0227590 A1 | | 10/2005 | Sung |
| 2006/0211338 A1 | | 9/2006 | Heilmaier et al. |
| 2006/0218867 A1 | | 10/2006 | Koshiyama et al. |
| 2008/0014839 A1 | | 1/2008 | Pietsch et al. |
| 2008/0233840 A1 | | 9/2008 | Pietsch et al. |
| 2008/0265375 A1 | | 10/2008 | Pietsch et al. |
| 2009/0029552 A1 | | 1/2009 | Schwandner et al. |

FOREIGN PATENT DOCUMENTS

| | | |
|---|---|---|
| DE | 102007019565 A1 | 9/2008 |
| DE | 102007035266 A1 | 1/2009 |
| EP | 0955126 A2 | 11/1999 |
| JP | 2001-135605 A | 5/2001 |
| JP | 2001-144060 A | 5/2001 |
| JP | 2003158102 A | 5/2003 |
| JP | 2004-529488 A | 9/2004 |
| JP | 2004-335978 A | 11/2004 |
| JP | 2005-072071 A | 3/2005 |
| JP | 2005-268667 A | 9/2005 |
| JP | 2005251776 A | 9/2005 |
| JP | 2006-527664 A | 12/2006 |
| JP | 2008-18528 A | 1/2008 |
| KR | 20060101391 | 9/2006 |
| KR | 20080085684 | 9/2008 |
| WO | 9213680 A1 | 8/1992 |

OTHER PUBLICATIONS

K. Sawano, et al., Surface smoothing of SiGe strain-relaxed buffer layers by chemical mechanical polishing, Materials Science and Engineering B89 (2002), pp. 406-409.

* cited by examiner

*Primary Examiner* — Lan Vinh
(74) *Attorney, Agent, or Firm* — Brooks Kushman P.C.

(57) ABSTRACT

Semiconductor wafer provided with a strain-relaxed layer of $Si_{1-x}Ge_x$, are polished in a first step of mechanical machining of the $Si_{1-x}Ge_x$ layer of the semiconductor wafer in a polishing machine using a polishing pad containing fixedly bonded abrasive materials having a particle size of 0.55 μm or less, and also a second step of a chemomechanical machining of the previously mechanically machined $Si_{1-x}Ge_x$ layer of the semiconductor wafer using a polishing pad and with supply of a polishing agent slurry containing abrasive materials.

21 Claims, No Drawings

METHOD FOR POLISHING A SEMICONDUCTOR WAFER WITH A STRAINED-RELAXED $SI_{1-x}GE_x$ LAYER

CROSS-REFERENCE TO RELATED APPLICATIONS

This application claims priority to German Application DE 10 2008 059 044.4 filed Nov. 26, 2008, which is herein incorporated by reference.

BACKGROUND OF THE INVENTION

1. Field of the Invention

The invention relates to a method for polishing a semiconductor wafer provided with a strained-relaxed $Si_{1-x}Ge_x$ layer.

2. Background Art

Modern applications of microelectronics such as information and communication technology, for example, demand ever higher integration density and ever shorter response times and clock breaks of the underlying microelectronic components. Examples of components are memory cells, switching and control elements, transistors, logic gates and the like. These are produced from substrates composed of semiconductor materials. Semiconductor materials comprise elemental semiconductors such as silicon and occasionally also germanium or compound semiconductors such as gallium arsenide (GaAs), for example. One measure of the switching speed is the mobility of the charge carriers (free electrons, holes). The mobility is the average drift velocity of the charge carriers in the crystal lattice of the semiconductor material relative to the applied electric field (electrical voltage per unit distance). The electron mobility is significantly lower for pure silicon than for GaAs, for example. Nevertheless, silicon is the standard material in microelectronics owing to numerous advantages. Silicon is available expediently, easily and virtually without limit, and it is non-toxic, can be produced very cleanly, can be processed well with high freedom from defects, and has a stable oxide (dielectric). Therefore, there is a desire to realize particularly fast components likewise on the basis of silicon technology.

For a given material, it is possible to increase the charge carrier mobility only by artificially altering the properties of the crystal lattice. It is known from theoretical investigations that, in particular, a strain of the crystal lattice (extension, distortion) increases the mobility. The average atomic spacing (lattice constant) of germanium, which is homologous with respect to silicon, is approximately 4% greater than that of silicon. A silicon crystal with incorporated germanium atoms therefore has a higher lattice constant than pure silicon. It is produced by depositing a silicon layer with a germanium proportion that increases slowly with the layer thickness on a defect-free planar and pure silicon starting surface. This is done from the vapor phase by means of thermolysis ("chemical vapor deposition", CVD) of gaseous germanium-containing precursors, such as $GeH_4$, $GeCl_4$ and $GeHCl_3$, for example, on the surface, or by vapor deposition using particle beams (Molecular beam epitaxy, MBE). This gradient layer having variable Si/Ge stoichiometry keeps down the strain built up on account of the lattice mismatch of silicon and germanium in the crystal during the growth. A further relaxation is achieved by finally depositing a stoichiometrically constant buffer layer with the germanium proportion of the last layer of the $Si_{1-x}Ge_x$ gradient layer. The overall layer construction is referred to as a relaxed layer ("strain-relaxed layer").

If pure silicon with a small layer thickness is deposited on the relaxed layer, the layer constrains its atomic spacing on the silicon atoms. The deposited silicon layer is laterally extended and is therefore referred to as lattice-strained silicon ("strained silicon"). Components structured in such a strained silicon layer have a charge carrier mobility that is increased according to the degree of strain and thus according to the germanium proportion in the relaxed layer.

A prerequisite for functional components having shorter switching and charge carrier transport times is substantial freedom from defects in the strained silicon layer. It is found that part of the strain of the $Si_{1-x}Ge_x$ gradient layer on account of the lattice mismatch is released in the form of regularly occurring lattice defects. The latter form a network of so-called dislocation defects (screw dislocations) at the piercing points of the growth surface. This defect network leads to regular height modulations of the surface. On the preferred Si(100) substrate, these faults resemble a rhomboidal patching of the surface and are therefore referred to as a "cross-hatch defect pattern".

The surface of $Si_xGe_{1-x}$ layers is therefore often characterized by a pattern caused by dislocations and known as "cross hatch", and must generally be smoothed before one or more further layers can be deposited thereon.

U.S. Pat. No. 6,475,072 and also Sawano et al., Materials Science and Engineering B89 (2002) 406-409, describe polishing methods directed towards smoothing $Si_{1-x}Ge_x$ layers. The methods involve a chemical mechanical polishing (CMP), wherein the semiconductor wafer is moved, with application of polishing pressure, over a rotating polishing plate provided with a polishing pad, while a polishing agent is supplied between the polishing pad and the $Si_{1-x}Ge_x$ layer to be polished. The remaining roughness, measured by AFM ("atomic force microscopy"), is in the best case 5 Å RMS ("root mean square"), in relation to a measurement grid having the area of 10 μm×10 μm. However, a surface polished in this way has disturbing scratches which, owing to their typical widths and depths in the submicron range, are often also referred to as "nanoscratches". $Si_{1-x}Ge_x$ layers planarized according to known methods are accordingly still too rough to be able to deposit thereon a strained silicon layer for particularly demanding applications which is sufficiently free of defects, smooth, and planar.

DE 102 007 019 565 A1 discloses a method for the single-side polishing of semiconductor wafers provided with a relaxed $Si_{1-x}Ge_x$ layer, comprising polishing a multiplicity of semiconductor wafers in a plurality of polishing passes, wherein one polishing pass comprises a polishing step and at least one of the semiconductor wafers with a polished $Si_{1-x}Ge_x$ layer is obtained at the end of each polishing pass. The semiconductor wafer is moved during the polishing step, with application of polishing pressure, over a rotating polishing plate provided with a polishing pad, and a supply of polishing agent between the polishing pad and the semiconductor wafer. A polishing agent containing an alkaline component and a germanium-dissolving component is supplied.

Particles containing germanium which are left behind if silicon is dissolved under the conditions of chemical mechanical polishing are regarded as the cause of the comparatively high roughness and the nanoscratches after polishing in accordance with the previously known methods. According to DE 102 007 019 565 A1 it does not suffice to remove these particles mechanically, for example in the course of conditioning the polishing pad. Rather, it is necessary to begin dissolving these particles chemically as early as during the polishing.

SUMMARY OF THE INVENTION

It was an object of the present invention to provide an alternative to the method proposed in DE 102 007 019 565 A1. These and other objects are achieved by means of a method for the single-side polishing of semiconductor wafers provided with a strained-relaxed layer of $Si_{1-x}Ge_x$, comprising a first step of mechanical machining a side of the semiconductor wafer in a polishing machine using a polishing pad containing fixedly bonded abrasive materials having a particle size of 0.55 μm or less effected with a supply of a polishing agent solution that is free of solids, and also a second step of chemomechanical machining of the previously mechanically machined side of the semiconductor wafer using a polishing pad and with supply of a polishing agent slurry containing abrasive materials

DETAILED DESCRIPTION OF THE PREFERRED EMBODIMENT(S)

The invention thus pertains to a method for the single-side polishing of semiconductor wafers provided with a strained-relaxed layer of $Si_{1-x}Ge_x$, comprising a first step of mechanical machining a side of the semiconductor wafer in a polishing machine using a polishing pad containing fixedly bonded abrasive materials having a particle size of 0.55 μm or less effected with a supply of a polishing agent solution that is free of solids, and also a second step of chemomechanical machining of the previously mechanically machined side of the semiconductor wafer using a polishing pad and with supply of a polishing agent slurry containing abrasive materials.

In principle, the semiconductor wafer, with the aid of a polishing head, is pressed with the side to be polished (that with the $Si_{1-x}Ge_x$ layer) against the polishing pad lying on a polishing plate. A polishing head also includes a retainer ring which laterally encloses the substrate and prevents it from sliding from the polishing head during polishing. In the case of modern polishing heads, the side of the semiconductor wafer which is remote from the polishing pad bears on an elastic membrane that transmits the polishing pressure exerted. The membrane is part of a possibly subdivided chamber system that forms a gas or liquid cushion.

However, polishing heads are also in use in which an elastic support ("backing pad") is used instead of a membrane. This elastic support is generally applied on a solidly manufactured plate ("backing plate"). Between the "backing pad" and the rear side of the wafer, an air cushion can then optionally be generated over various zones on the rear side of the wafer. Furthermore, there are also polishing heads in use in which the wafer is polished with the aid of a so-called "template", that is to say by means of a "backing plate" and a retainer ring applied to the elastic support ("backing pad"). The retainer ring, which has a defined thickness, ensures that the wafer maintains its position in the carrier during the polishing. The thickness of the retainer ring can be chosen such that it is either thicker than the wafer itself—this then being referred to as a so-called "wafer underhang"—or thinner, in which case a so-called "wafer overhang" is involved.

The semiconductor wafer is polished with supply of a polishing agent between the substrate and the polishing pad and with rotation of the polishing head and of the polishing plate. In this case, the polishing head can additionally also be moved translationally over the polishing pad, whereby more comprehensive use of the polishing pad area is obtained.

The method according to the invention can equally be carried out on single-plate and multi-plate polishing machines. The use of multi-plate polishing machines preferably having two, more preferably three, polishing plates and polishing heads is preferred. Different polishing pads and different polishing agents can also be used in this case.

The first step of the method corresponds to a mechanical ultrafine grinding using a polishing pad containing extremely fine abrasives in bonded form. This method differs from conventional single- or double-side fine grinding, which is used in part in silicon technology, e.g. as a DDG ("double disk grinding") step using grinding disks with fine granulation, in that a) the machining is effected in a polishing machine (different kinematics, no grinding disks that are fed into the workpiece) and b) the grinding disks in the case of fine grinding have a significantly higher granulation in comparison with the polishing pads with abrasives that are used. Methods and apparatuses for the surface grinding of a semiconductor wafer are known for example from U.S. Pat. No. 5,400,548 or from EP 0955126. Grinding disks having a grain size of 2000-8000 mesh are usually used in these methods (grain sizes according to Japanese Industrial Standard JIS R 6001: 1998). Grinding disks with 2000-8000 mesh have an average grain diameter of 1-7 μm according to the JIS-Standard. By contrast, an average grain diameter of less than or equal to 0.55 μm as in the first step of the method according to the invention corresponds according to JIS to a granulation of 10,000 mesh or finer. In particular the range of 0.1 to 0.3 μm is particularly preferred for the present method, which corresponds to a granulation of 15,000-30,000 mesh (JIS).

The second step is preferably a conventional CMP polishing. The proportion of the abrasive material in the polishing agent slurry in accordance with the second step of the method of the invention is preferably 0.25 to 20% by weight, more preferably 0.25 to 1% by weight. The size distribution of the abrasive material particles is preferably monomodal in nature, and the average particle size is 5 to 300 nm, more preferably 5 to 50 nm.

The abrasive material comprises a material that mechanically removes the substrate material, preferably one or more of the oxides of the elements aluminum, cerium or silicon. A polishing agent slurry containing colloidally dispersed silicic acid (silicasol) is particularly preferred, e.g. a polishing agent slurry generally known by the designation "Glanzox 3900". "Glanzox 3900" is the product name for a polishing agent slurry which is offered as a concentrate by Fujimi Incorporated, Japan. The concentrate, having a pH of 10.5, contains approximately 9% by weight of colloidal $SiO_2$ having an average particle size of 30 to 40 nm.

The pH value of the polishing agent slurry preferably lies within a range of 9 to 11.5 and is preferably set by additives such as sodium carbonate ($Na_2CO_3$), potassium carbonate ($K_2CO_3$), sodium hydroxide (NaOH) potassium hydroxide (KOH), ammonium hydroxide (NaOH), tetramethylammonium hydroxide (TMAH) or any desired mixtures of these compounds. The use of potassium carbonate is especially preferred. The polishing agent slurry can furthermore contain one or more further additives, for example surface-active additives such as wetting agents and surfactants, stabilizers acting as protective colloids, preservatives, biocides, alcohols and complexing agents.

The second step of the method according to the invention is preferably also effected on a polishing pad containing fixedly bonded abrasive materials. However, is likewise preferred to use a conventional removal polishing pad containing no bonded abrasives. By way of example, a typical CMP polishing pad ("finishing pad") such as the SPM 3100 from Rodel® is suitable for this purpose.

The polishing pad is preferably one which, as in the first step, contains fine abrasives having a granulation of 0.55 μm or less, more preferably 0.1-0.55 μm, and most preferably 0.1-0.3 μm.

It is especially preferred to carry out both steps on one and the same polishing plate using the same polishing pad, the two machining steps essentially differing in that a polishing agent solution that is free of solids and contains no polishing chemical (which would cause chemical, e.g. etching removal) is added in the first step, i.e. the first step brings about purely mechanical material removal, while a polishing agent slurry that is customary in CMP is added in the second step, i.e. the machining in the second step signifies a simultaneous chemical and mechanical removal.

The polishing agent solution in according with the first step of the method according to the invention is water in the simplest case, preferably deionized water (DIW) having the customary purity for use in the semiconductor industry.

However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The use of potassium carbonate is especially preferred. In this case, the pH value of the polishing agent solution preferably lies within a range of 10 to 12.5 and the proportion of the compounds mentioned above in the polishing agent solution is preferably 0.01 to 10% by weight, more preferably 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

The first step involves using a polishing pad containing bonded abrasive material having an average particle size of 0.55 μm or less, preferably abrasives having an average particle size of greater than or equal to 0.1 μm and less than or equal to 0.55 μm, or to put it another way, 30,000-10,000 mesh according to JIS.

Suitable abrasive materials, for example particles of oxides of the elements cerium, aluminum, silicon, zirconium, iron, chromium, and particles of hard materials such as silicon carbide, boron nitride and diamond.

Particularly suitable polishing pads have a surface topography shaped by replicated microstructures. These microstructures ("posts") have for example the form of columns having a cylindrical or polygonal cross section or the form of pyramids or truncated pyramids.

More detailed descriptions of such polishing pads, which are also known as FAP polishing pads (FAP="Fixed Abrasive Polishing"), are available for example by means of WO 92/13680 A1 and US 2005/227590 A1.

The use of polishing pads with abrasives composed of aluminum oxide (microreplicated structures in pyramid form), and an average particle size of 0.3 μm is particularly well suited. Such polishing pads are available from 3M Corp., USA.

What is likewise especially preferred is the use of polishing pads with abrasives composed of diamond and having an average particle size of 0.1-0.55 μm, with abrasives composed of aluminum oxide ("white aluminum oxide") and having an average particle size of 0.1-0.55 μm or with abrasives composed of silicon carbide ("green silicon carbide") and having an average particle size of 0.1-0.55 μm. Polishing pads of this type are offered e.g. by Nihon Micro Coating Co., Ltd., but are not provided for the polishing of silicon or silicon-germanium, but rather specifically for polishing glass (LCD glass panels/fiber-optics). Therefore, these pads, unless produced differently as required, have a size and/or form that is not appropriate for use in conventional silicon polishing machines. However, this can be rectified by these pads being cut to size and adhesively bonded e.g. onto an FAP polishing pad, the topmost layer of the FAP pad, namely the part with the microreplicated structures (replicated microstructures), being removed beforehand.

The use of polishing pads containing abrasives selected from diamond, aluminum oxide and silicon carbide, having an average particle size of 0.1-0.55 μm, for the mechanical machining of silicon-germanium layers is in itself regarded as novel and inventive.

It has been shown that the method of the invention is particularly well suited to planarizing $Si_{1-x}Ge_x$-layers having a high proportion of Ge. Wafers having a high proportion of Ge are becoming increasingly of interest owing to the fact that it is desired to deposit specific layer structures on such $Si_{1-x}Ge_x$-layers to an increased extent.

The semiconductor wafer which is machined by the method according to the invention is preferably a wafer composed of monocrystalline silicon that is provided with a strained-relaxed $Si_{1-x}Ge_x$-layer. The proportion of Ge in the strained-relaxed $Si_{1-x}Ge_x$-layer is preferably at least 20%, that is to say that x is greater than or equal to 0.2. The proportion of Ge in the strained-relaxed $Si_{1-x}Ge_x$-layer of the semiconductor wafer machined by the method is preferably greater than or equal to 20% and less than or equal to 80%. For wafers having such a high proportion of Ge, a conventional CMP polishing is no longer sufficient to achieve the required planarity, geometry and nanotopology. However, the method of the invention now offers a solution in respect thereto.

The first machining step, essentially a mechanical ultrafine grinding step, makes it possible to achieve the necessary geometry of the wafer, while the subsequent chemomechanical machining step specifically influences the surface properties of the $Si_{1-x}Ge_x$-layer by reducing the roughness after mechanical ultrafine grinding and eliminating the defects of the wafer surface.

In particular, it has been very surprisingly discovered that the different properties of silicon and germanium which are associated with a different removal behavior are of chemical nature and play practically no part in a purely mechanical removal as in the first step of the method according to the invention. This is totally unexpected. It is now shown that removal behavior proceeds significantly more homogeneously; selective removal of Si and Ge cannot be observed. Additional polishing chemicals such as agents for dissolving germanium (e.g. hydrogen peroxide, ozone, sodium hypochlorite, sodium perchlorate, sodium chlorate or other oxidizing agents) as in the prior art are not necessary, which makes the process easier to handle and more cost-effective by comparison with the prior art. Good properties with regard to geometry and nanotopology, good roughness, and freedom from defects of the surface is the overall result.

As already mentioned above, both single-plate and multi-plate polishing machines are suitable for carrying out the method according to the invention. By way of example, a CMP machine from Strasbaugh Inc. of the "nHance 6EG" type is suitable. A multi-plate machine such as the AMAT reflection from Applied Materials Inc. is likewise suitable.

The polishing apparatus from Strasbaugh Inc. has one polishing plate with one polishing pad and one polishing head, which machines a semiconductor wafer fully automatically. The polishing head is mounted cardanically and comprises a fixed base plate coated with a "backing pad", and a movable retainer ring. Through holes in the base plate, air cushions can be established in two concentric pressure zones, an inner and an outer zone, the semiconductor wafer floating on the air cushions during polishing. Pressure can be applied to the movable retainer ring by means of compressed air bellows in order thus to pretension the polishing pad upon contact with the semiconductor wafer and to keep it planar.

By contrast, the AMAT Reflection has three polishing plates which can carry different polishing pads, and comprises a turret carrying a plurality of polishing heads which are arranged fixedly with respect to one another and which each receive a semiconductor wafer. The semiconductor wafers can be moved further from one polishing plate to the next synchronously and can be machined successively in each case on one of the three polishing plates. This polishing machine comprises a 5-zone membrane carrier, which permits the pressure profile of the carrier to be set differently in 5 zones.

The polishing parameters depend on which polishing machine is used for carrying out the method according to the invention. The customary process settings for conventional polishing machines are known to those skilled in the art of polishing semiconductor wafers.

Particularly suitable process parameters when using an AMAT Reflection polishing machine and essential differences with respect to the parameters to be chosen if a Strasbaugh nHance 6EG is used are presented below. The specified parameter ranges specify process windows that can be worked in so as to successfully employ the method according to the invention, but are not intended to restrict the general concept of the invention in any way.

The preferred pressure profiles of the membrane carrier of the AMAT Reflection both in the first and in the second step of the method according to the invention lie within the range of approximately 3 to approximately 4 psi. The contact pressure of the retainer ring is 7-8 psi.

When using a polishing machine from Strasbaugh Inc. of the "nHance 6EG" type, the polishing pressure chosen is preferably 3-7 psi, most preferably 6-7 psi.

The volumetric flow rate of the grinding or polishing medium (water/polishing agent) is preferably approximately 0.3 to approximately 1.0 liter per minute. A significantly higher volumetric flow rate of up to 3.0 liters per minute is also preferred in the case of the Strasbaugh nHance 6EG.

The polishing times preferably lie within the range of 10 sec to 300 sec. The rotational speed of the polishing plate is preferably 60 to 200 rpm. The range of 80 to 140 rpm is particularly preferred.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for polishing a semiconductor wafer provided with a strained-relaxed layer of $Si_{1-x}Ge_x$, comprising a first step of a mechanical machining of the $Si_{1-x}Ge_x$ layer of the semiconductor wafer in a polishing machine using a polishing pad containing fixedly bonded abrasive materials having a particle size of 0.55 µm or less, and a second step of chemo mechanical machining of the previously mechanically machined $Si_{1-x}Ge_x$ layer of the semiconductor wafer using a polishing pad and with supply of a polishing agent slurry containing abrasive materials.

2. The method of claim 1, wherein the proportion of the abrasive material in the polishing agent slurry in the second step of the method is 0.25 to 20% by weight.

3. The method of claim 1, wherein the proportion of the abrasive material in the polishing agent slurry in the second step of the method is 0.25 to 1% by weight.

4. The method of claim 1, wherein the abrasive material in the polishing agent slurry has an average particle size of 5 to 300 nm.

5. The method of claim 4, wherein the abrasive material in the polishing agent slurry has an average particle size of 5 to 50 nm.

6. The method of claim 1, wherein the abrasive material in the polishing agent slurry comprises one or more of the oxides of the elements aluminum, cerium or silicon.

7. The method of claim 6, wherein the polishing agent slurry contains colloidally disperse silicic acid.

8. The method of claim 1, wherein the second step of the method is also effected on a polishing pad containing fixedly bonded abrasive materials.

9. The method of claim 8, wherein the polishing pad contains fine abrasives having a granulation of 0.55 µm or less.

10. The method of claim 1, wherein a removal polishing pad containing no bonded abrasives is used in the second step of the method.

11. The method of claim 9, wherein the first and second machining steps are effected on a polishing plate of a polishing machine using the same polishing pad.

12. The method of claim 1, wherein the first step of a mechanical machining is effected with supply of a polishing agent solution that is free of solids.

13. The method of claim 12, wherein the polishing agent solution of the first step of the method is water.

14. The method of claim 13, wherein the water is deionized water.

15. The method of claim 1, wherein the polishing agent solution contains one or more of the compounds sodium carbonate ($Na_2CO_3$), potassium carbonate ($K_2CO_3$), sodium hydroxide (NaOH), potassium hydroxide (KOH), ammonium hydroxide ($NH_4OH$), and tetramethylammonium hydroxide (TMAH).

16. The method of claim 15, wherein the proportion of the compounds in the polishing agent solution is 0.01 to 10% by weight.

17. The method of claim 1, wherein the pH of the polishing agent solution lies within a range of 10 to 12.5.

18. The method of claim 1, wherein a polishing pad containing bonded abrasives having an average particle size of greater than or equal to 0.1 µm and less than or equal to 0.55 µm is used in the first step of the method.

19. The method of claim 18, wherein a polishing pad containing bonded abrasives having an average particle size of greater than or equal to 0.1 µm and less than or equal to 0.3 µm is used in the first step of the method.

20. The method of claim 18, wherein the abrasive material of the polishing pad contains at least one of particles of silicon carbide, boron nitride, diamond, and oxides of the elements cerium, aluminum, silicon, zirconium, iron or chromium.

21. The method of claim 1, wherein the semiconductor wafer machined by the method according to the invention comprises a strained-relaxed $Si_{1-x}Ge_x$ layer, where x is greater than or equal to 0.2.

* * * * *